United States Patent [19]

Holzschuh et al.

[11] Patent Number: 4,803,544
[45] Date of Patent: Feb. 7, 1989

[54] PREFABRICATED STRIP CONDUCTOR NETWORK ASSEMBLY UNIT AND PROCESS FOR MAKING SAME

[75] Inventors: Wolfgang Holzschuh, Lauterbach; Wolfgang Ganter, Schramberg, both of Fed. Rep. of Germany

[73] Assignee: Junghans Uhren GmbH, Schramberg, Fed. Rep. of Germany

[21] Appl. No.: 71,303

[22] Filed: Jul. 9, 1987

[30] Foreign Application Priority Data

Jul. 11, 1986 [DE] Fed. Rep. of Germany ....... 3623419

[51] Int. Cl.⁴ ..................... H01L 23/28; H01L 23/02; H01L 23/48
[52] U.S. Cl. ......................................... 357/72; 357/70; 357/74; 174/52.4
[58] Field of Search ....................... 357/70, 72, 74, 69; 174/52 FP

[56] References Cited

U.S. PATENT DOCUMENTS

| | | | |
|---|---|---|---|
| 3,986,335 | 10/1976 | Harper | 357/70 |
| 4,218,701 | 8/1980 | Shirasaki | 357/72 |
| 4,714,952 | 12/1987 | Takekawa et al. | 357/70 |

FOREIGN PATENT DOCUMENTS

| | | |
|---|---|---|
| 2619833 | 11/1976 | Fed. Rep. of Germany . |
| 56-164558 | 12/1981 | Japan ..................... 357/70 |
| 2163906 | 3/1986 | United Kingdom . |

*Primary Examiner*—J. Carroll
*Assistant Examiner*—Ngan V. Ngo
*Attorney, Agent, or Firm*—Burns, Doane, Swecker & Mathis

[57] ABSTRACT

A strip conductor assembly is prefabricated so as to be able to be mounted as a unit into a circuit board of an electro-mechanical clock movement without thereafter requiring further fabrication. The assembly is formed by attaching a circuit chip to a strip conductor network which has already had the necessary gaps formed between ends of respective strips. Wires are attached between the chip and respective strips, and a reinforcing cap is attached to the network so as to interconnect and rigidify certain ones of the strip conductors. A molten plastic mass is poured into an open side of the cap. The mass hardens to completely encapsulate both sides of the strips as well as the chip and wires. That assembly is then cut from the network to form a one-piece prefabricated unit which can be installed in a circuit board of a clock movement.

4 Claims, 1 Drawing Sheet

PREFABRICATED STRIP CONDUCTOR NETWORK ASSEMBLY UNIT AND PROCESS FOR MAKING SAME

BACKGROUND OF THE INVENTION

The invention concerns a process for assembling a strip conductor network with an integrated circuit for application to a circuit board of an electro-mechanical clock movement, and also concerns the thus-assembled strip conductor network.

Apparatus and process of this generic type are known from German Pat. No. 26 19 833 as depicted in FIG. 2 of that patent. A strip conductor network for a circuit board is also described in German Pat. No. 3,427,908 corresponding to British Published Application No. 2,163,906 of the present inventor.

It is provided according to German Pat. No. 26 19 833 to bond the circuit (chip) on a strip conductor network cut from a support strip, and bond wiring is connected between the circuit and the respective strip conductors. The network preassembled in this manner is fastened to the insulating support of a circuit board of the clock mechanism. Finally, gaps are cut in the strip conductors in accordance with the required electrical operation of the circuit. (Such gaps were not earlier cut in order to maintain the stability of the network during transfer to the circuit board.) Thereafter, the chip is cast in epoxy. This, however, involves significant restrictions relative to manipulation and also to the configuration of the strip conductors. The environment of the bond wiring between the circuit and the adjacent strip conductors, which is particularly sensitive to mechanical stress, is exposed to appreciable stresses both during the insertion of the network into the circuit board and in the course of the punching out of the remaining bridges, which stresses are capable of leading to functional interference with the bond connections and thus later with the entire electromechanical clock movement.

In view of these shortcomings, it is an object of the invention to improve the processes and apparatuses of this generic type in a manner such that manufacturing complications and operating risks related to the assembly of a circuit board with preassembled strip conductors are reduced, thereby further reducing the manufacturing effort involved in the construction of large clock movements.

This object is attained according to the invention which relates to a process for making a strip conductor network assembly for application to a circuit board of an electro-mechanical clock movement. The process involves providing a strip conductor network including gaps between the ends of selected strip conductors thereof. A circuit chip is adhered to the strip conductor network. Bond wiring is secured between the adhered circuit chip and the strip conductor network. A rigid protective cap is inserted over the portion of the strip conductor network containing the circuit chip and the bond wiring so as to interconnect a plurality of the strip conductors. That portion of the strip conductor network is cut-out, such that the cut-out portion, the circuit board, the bond wiring, and the protective cap together form a unitary member which can be applied to a clock movement circuit board.

Preferably, before the portion of the strip conductor network is cut-out, a molten plastic material is poured into the cap in order to encapsulate therein the strip conductors, the circuit chip, and the bond wiring.

The present invention also concerns the strip conductor network assembly adapted for application to a circuit board of an electro-mechanical clock movement. The network assembly comprises a strip conductor network having gaps disposed between selected strip conductors thereof. A circuit chip is mounted on the network. Bond wiring connects the circuit chip with the network. A protective cap is connected to a plurality of the strip conductors for rigidifying the latter.

Preferably, the interior of the cap is filled with a plastic mass in which the circuit chip and bond wiring are encased.

In accordance with the invention, the cutting of the gaps in the network to form the individual strip conductors required for proper electric operation is carried out prior to the connection of bond wiring and in particular prior to the mounting of the network on its circuit board. This renders it certain that chips are mounted on and bonded to networks which are in their mechanical and geometrical final state and can already have been exposed to appropriate quality control measures (for example, by means of silhouette image processing), so that the possibility of equipping mechanically unusable networks with the expensive circuit chip and bond wiring connections may be avoided from the onset.

The thus-formed network has a chip adhered thereto, and bond wiring is connected between the chip and the strip conductors. Thereafter, the strip conductors are mechanically rigidified and their connecting surfaces and bond wiring are protected by the positive attachment of a cap to the network strip conductors. The cap simultaneously establishes a mechanical connection between the individual strip conductor ends leading to the bond wires and thus counteracts any potential mechanical damage to the bond wire connections due to mechanical bending stress in the course of the further processing of the network.

An additional mechanical protection of the network in the vicinity of the adhesively applied chip and bond wiring is obtained by the injection of a plastic mass (e.g., epoxy) into the cap. The mass, after cooling, intimately surrounds the chip and the bonding wires on the facing surface of the strip conductors, thereby contributing to the mechanical rigidity of the entire structure and to protect same against environmental effects. Preferably, enough plastic material is injected into the opening of the cap so that the strip conductors are surrounded by the solidifying mass even on the side facing away from the circuit and the wiring connections, i.e., the strip conductors are embedded along their surfaces and edges in their solidifying molding material and thereby fixed in their relative orientation.

THE DRAWING

The objects and advantages of the invention will become apparent from the following detailed description of a preferred embodiment thereof, in connection with the accompanying drawings in which like numerals designate like elements, and in which:

FIG. 1 depicts a segment of a strip conductor network equipped with a circuit along the section line I—I in FIG. 2, but prior to the injection molding of the inside of the cap with the molding mass, and FIG. 2 is a sectional view along the line II—II in FIG. 1 after the casting of the inside of the cap with the molding mass.

DETAILED DESCRIPTION OF A PREFERRED EMBODIMENT OF THE INVENTION

Figure 1:
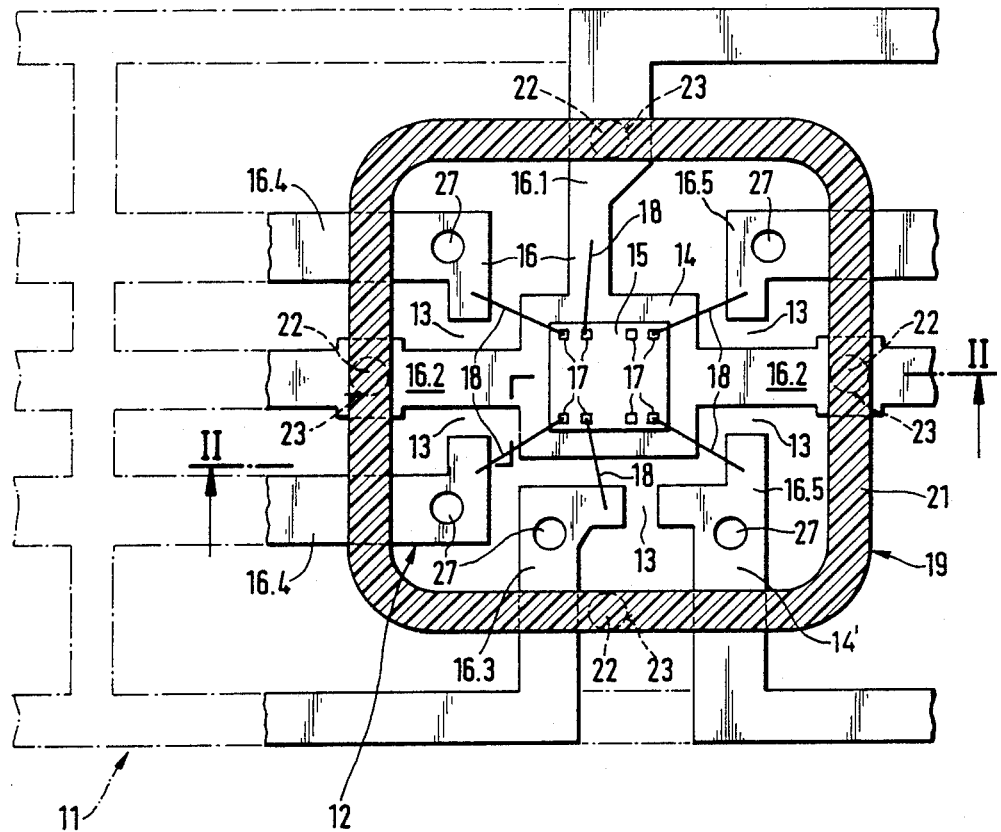

A strip 11 comprises a network of strip conductors 12, one of which includes a mounting surface 14. The conductors are discontinuous, whereby gaps 13 are formed in the vicinity of the mounting surface. The gaps 13 can be formed during the initial stamping of the strip, or thereafter by a punching step. The mounting surface 14, which carries an integrated circuit formed on a circuit chip 15, is integrated in a single piece with one of the strip conductors 16.1 for both mechanical support and the positive supply of electrical power to the circuit chip 15. The surface 14 is also integral with other strip conductors 16.2 which provide mechanical support only. The connecting points 17 of the circuit chip 15 required for the electrical operation of the circuit chip 15, are connected electrically by means of bonding wires 18 with the functionally associated strip conductors 16, i.e., with the afore-mentioned strip conductor 16.1 (for the supply of positive power), and with the strip conductors 16.4 and 16.5 (for the supply of current of opposing polarity, and connection with an oscillator and a motor of an electro-mechanical clock movement).

The bonding wires 18 are connected directly with the individual strip conductors 12, after the circuit chip 15 has been adhesively bonded to the mounting surface 14.

Figure 2:
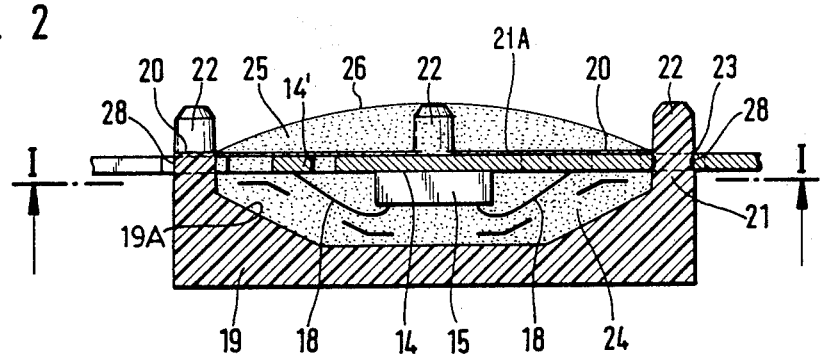

Following the above-described assemblage, a protective cap 19, prefabricated by injection molding, is placed over the circuit chip 15 and the surrounding terminals of one side of the strip conductors 16. The cap includes an inner surface 19A which defines a closed cavity or space 24 around the chip. The cap is initially arranged such that a rim 20 of its side wall 21 rests on the surface of the strip conductors 16, while molded pins 22 projecting beyond the plane of the rim 20 engage holes 23 which are punched into at least some of the strip conductors 16. The lateral wall 21 of the cap 19 is then softened and pressed against the strip conductors until the latter become embedded within the wall 31. Softening of the lateral wall may be achieved by supplying energy in the form of heat or an ultrasonic effect. In any case, the strip conductors 16 are impressed into the original plane of the rim 20, until the portions of the rim disposed between the strip conductors 16 extend to a position beyond the strip conductors as can be seen in FIG. 2. As a result, the inner space 24 of the cap contains ridges 21A defined by the portion of the wall 21 which projects beyond the strip conductors 16.

Preferably, a frictional hold of the pins 22 in the associated holes 23 is provided, the pins being made slightly conical to facilitate a pressing of the pins into the holes 23.

FIG. 1 depicts a case wherein, due to the particular configuration of the strip conductors 16, no holding hole 23 is available for one of the pins 22 (i.e., the lowermost pin 22). Hence, the pin simply extends through an open area between adjacent strip conductors.

For the further protection of the circuit chip 15 and its bonding wires 18 and the additional mechanical securing of this assembly, while simultaneously rigidifying the network 12 in the vicinity of the circuit chip 15, the assembly is turned over after the mounting of the circuit chip 15 and the insertion of the cap 19, so that the inside of the cap 19, now frictionally held under the network 19, is open at the top. Into this inner space 24, through the punched holes 13 of the network 12, a plastic molding mass 25 is injected in the liquid state. The mass eventually solidifies after filling all of the free space, thereby providing a mechanical protection of the bonded circuit chip 15, which is now encapsulated, as is known previously from the casting of circuits with lead frame.

To provide good adhesion of the molding material and thus a good mechanical stability of the network 12 in the vicinity of the circuit chip 15 (as shown in FIG. 2) preferably not only the inner space 24 is filled with the molding mass 25, but also the surface tension of the initially liquid molding mass 25 is utilized to form a hill 26 on the other side 14 of the strip conductors 16 facing away from the circuit chip 15. In the interest of a permanent, positive joint of the molding mass 25 on both sides of the strip conductors 16, the latter preferably have passage openings 27 (FIG. 1), so that the strip conductors 16 are encapsulated not only along their lateral edges, but also inside by the molding mass 25.

The ridges 21A prevent the initially liquid mass 25 from flowing past the cap, during the formation of the hill 26, at the intervals between the strip conductors (and from subsequently interfering, for example, with the cutting of the network 12 from the strip 11 or the embedding of the cut network 12 into a clock movement circuit board.) Thus, upon the injection of the initially liquid molding mass 25, the latter does not run out of the area of cap 19 in the lateral direction, but merely encloses the strip conductors 16 along their edges and the passage openings 27.

The assembly of the network 12 equipped with the circuit chip 15 and mechanically secured by the cap 19 and mass 25 can then be punched out of the strip 11 and inserted as a unit into an appropriately configured circuit board of a clock movement, as described in detail in German Pat. No. 3,427,908 which discloses a preferred embodiment of a circuit board.

The present invention provides significant advantages. Because the chip is attached to a network which is already formed with the gaps 13, and before the network is mounted on a circuit board, the network has already been subjected to quality control inspection. This eliminates the loss which would result if the cutting of gaps was improperly performed (leading to a rejection of the network) after the expense and effect of attaching the chip and bond wiring has taken place.

Even though the formation of the gaps tends to weaken the network, the attachment of the protective cap 19 rigidifies the network by establishing a mechanical connection between ends of individual strip conductors. Thus, the strip conductors will not become bent as a result of further handling.

The plastic mass 25 provides further rigidity as well as protection against environmental effects. By applying the mass on both sides of the conductor strips, as facilitated by the presence of the ridges 21A, the strip conductors become even more rigidified than would result from the application of a plastic mass on one side only.

Although the present invention has been described in connection with a preferred embodiment thereof, it will be appreciated by those skilled in the art that modifications, additions, subtitutions, and deletions not specifically described may be made without departing from the spirit and scope of the invention as defined in the appended claims.

What we claim is:

1. A strip conductor network module adapted to be installed in a circuit board of an electromechanical clock movement, said module comprising:

a strip conductor network defining first and second sides and having gaps disposed between selected strip conductors thereof, at least some of said strip conductors including through-holes, a circuit chip mounted on said first side of said network, and bond wiring connecting said circuit chip with said network, only one of said sides of said network being overlain by a protective cap, said one side comprising said first side, said protective cap including:

a plurality of pins frictionally mounted in said holes, and an inner surface spaced from said chip to form a closed cavity therearound, said cavity being filled with a hardenable plastic mass encasing said chip and said wiring.

2. Apparatus according to claim 1, wherein said cap includes a side wall in which said strip conductors are embedded.

3. Apparatus according to claim 2, wherein said side wall includes a rim which extends past a plane of said strip conductors to form ridges around said second side to retain said mass.

4. Apparatus according to claim 1, wherein said mass extends over said second side of said strip conductor network.

* * * * *